(12) United States Patent
Kim

(10) Patent No.: US 11,049,909 B2
(45) Date of Patent: Jun. 29, 2021

(54) ORGANIC LIGHT EMITTING DISPLAY DEVICE

(71) Applicant: LG Display Co., Ltd., Seoul (KR)

(72) Inventor: Kanghyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/583,720

(22) Filed: Sep. 26, 2019

(65) Prior Publication Data

US 2020/0119106 A1 Apr. 16, 2020

(30) Foreign Application Priority Data

Oct. 12, 2018 (KR) .......................... 10-2018-0122098

(51) Int. Cl.
| | |
|---|---|
| *H01L 51/56* | (2006.01) |
| *H01L 51/52* | (2006.01) |
| *H01L 27/32* | (2006.01) |
| *H01L 51/00* | (2006.01) |
| *H01L 51/50* | (2006.01) |

(52) U.S. Cl.
CPC ...... *H01L 27/3218* (2013.01); *H01L 27/3246* (2013.01); *H01L 51/0005* (2013.01); *H01L 51/5209* (2013.01); *H01L 51/56* (2013.01); *H01L 27/3248* (2013.01); *H01L 27/3272* (2013.01); *H01L 51/5012* (2013.01)

(58) Field of Classification Search
CPC ............. H01L 27/3218; H01L 27/3246; H01L 51/5012; H01L 51/0005
See application file for complete search history.

(56) References Cited

U.S. PATENT DOCUMENTS

| | | | | |
|---|---|---|---|---|
| 9,929,221 | B2 * | 3/2018 | Kim | H01L 27/3246 |
| 2007/0141781 | A1 * | 6/2007 | Park | H01L 29/40114 |
| | | | | 438/257 |
| 2007/0284648 | A1 * | 12/2007 | Park | H01L 29/792 |
| | | | | 257/316 |
| 2010/0071951 | A1 * | 3/2010 | Yoshida | H05K 3/4069 |
| | | | | 174/262 |
| 2014/0197385 | A1 * | 7/2014 | Madigan | H01L 51/56 |
| | | | | 257/40 |
| 2017/0287993 | A1 * | 10/2017 | Takata | H01L 51/0005 |

* cited by examiner

*Primary Examiner* — Bradley Smith
*Assistant Examiner* — David J Goodwin
(74) *Attorney, Agent, or Firm* — Seed Intellectual Property Law Group LLP

(57) ABSTRACT

The present disclosure provides an organic light-emitting display device that includes a substrate. A plurality of sub-pixels are arranged on the substrate, and each of the sub-pixels includes an organic light-emitting diode having a first electrode. A first bank has a plurality of first openings, and each of the first openings at least partially exposes a respective first electrode. A second bank has a plurality of second openings, and each of the second openings at least partially exposes one or more of the first electrodes. Each of a first set of the second openings exposes n first electrodes (n is a natural number equal to or greater than 1), and each of a second set of the second openings exposes m first electrodes (m is a natural number equal to or greater than 1), wherein n and m are different values.

18 Claims, 20 Drawing Sheets

ORGANIC LIGHT EMITTING DISPLAY DEVICE

CROSS-REFERENCE TO RELATED APPLICATION(S)

This application claims the priority benefit of Korean Patent Application No. 10-2018-0122098 filed on Oct. 12, 2018, which is incorporated herein by reference for all purposes as if fully set forth herein.

BACKGROUND

Technical Field

The present disclosure relates to an organic light-emitting display device that has novel bank structures.

Description of Related Art

Recently, various display devices that are less bulky and more lightweight than cathode ray tubes (CRTs) are being developed. Examples of these display devices include liquid crystal displays (LCDs), plasma display panels (PDPs), field emission displays (FEDs), organic light-emitting display devices, etc.

The organic light-emitting display devices are self-luminous devices, and offer several advantages such as fast response time, high light emission efficiency, high brightness, and wide viewing angle. Moreover, the organic light-emitting display devices may be implemented as a flexible display device because they can be fabricated on a flexible substrate such as plastic.

In keeping with the recent trend towards large-area, high-resolution organic light-emitting display devices, a single panel comprises a plurality of sub-pixels. Generally, masks are used to pattern red (R), green (G), and blue (B) sub-pixels. Thus, a large-area, high-resolution display device requires a corresponding large-area fine metal mask (FMM). However, a mask may become bent as the area thereof increases, which causes various problems such as deposition of an organic light-emitting material forming an emission layer at an incorrect position.

As a way to solve the problems of the aforementioned method of deposition using a mask, a solution process is getting attention because it is simple to implement and has advantages in large-area display devices. The solution process enables large-area patterning through inkjet printing or nozzle printing, without using a mask, and has a material use rate of 50 to 80%, which is very high compared to vacuum deposition which has a material use rate no higher than 10%. Also, the solution process offers good thermal stability and morphological properties because it provides a higher glass transition temperature than vacuum-deposited thin films.

However, forming an emission layer by a solution process can result in non-uniform thickness because its thickness varies depending on its position in a sub-pixel.

BRIEF SUMMARY

An aspect of the present disclosure is to provide an organic light-emitting display device that has novel bank structures.

An exemplary embodiment of the present disclosure provides an organic light-emitting display device comprising: a substrate; a plurality of sub-pixels on the substrate, each of the sub-pixels including an organic light-emitting diode having a first electrode; a first bank having a plurality of first openings, each of the first openings at least partially exposing a respective one of the first electrodes; and a second bank having a plurality of second openings, each of the second openings at least partially exposing one or more of the first electrodes, wherein the plurality of second openings includes: a first set of the second openings each of the second openings of the first set exposing n first electrodes (n is a natural number equal to or greater than 1); and a second set of the second openings, each of the second openings of the second set exposing m first electrodes (m is a natural number equal to or greater than 1), wherein n and m are different values.

Another exemplary embodiment of the present disclosure provides an organic light-emitting display device comprising: a substrate; a plurality of sub-pixels on the substrate, each of the sub-pixels including an organic light-emitting diode having a first electrode; a first bank having first openings each exposing at least one of the first electrodes; and a second bank having second openings each exposing at least one of the first electrodes, wherein a number of first electrodes exposed by a first one of the second openings is different from a number of first electrodes exposed by a second one of the second openings.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
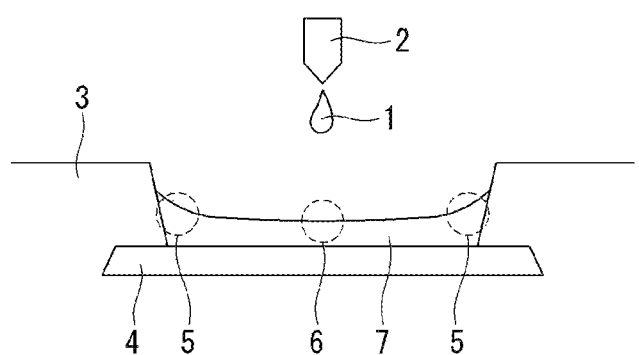
FIG. 1 is a schematic diagram for explaining problems of a solution process.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

FIG. 1 is a schematic diagram for explaining problems of a solution process.

Referring to FIG. 1, forming an organic light-emitting layer using a solution process (or soluble process) has the problem of deteriorating the light emission characteristics of organic light-emitting display devices due to pileup. More specifically, an organic light-emitting material 1 is dropped onto a first electrode 4 divided up by a bank 3 by inkjet equipment 2 or the like. The dropped organic light-emitting material 1 has varying thicknesses depending on the position, due to differences in hardening rate in the hardening process. That is, a non-uniform organic light-emitting layer 7 is formed which is thick at the edge 5 adjoining the bank and thin at the center 6.

The formation of the non-uniform organic light-emitting layer 7 can bring about the problem of deterioration in display quality because brightness varies with position. In addition, the lifetime of the device can degrade due to differences in current density within the organic light-emitting layer 7, or the process yield can be lowered due to formation of dark spots. In view of this, there is a need to reduce the pile-up area as much as possible when forming the emission layer by using the solution process.

First Exemplary Embodiment

Figure 2:
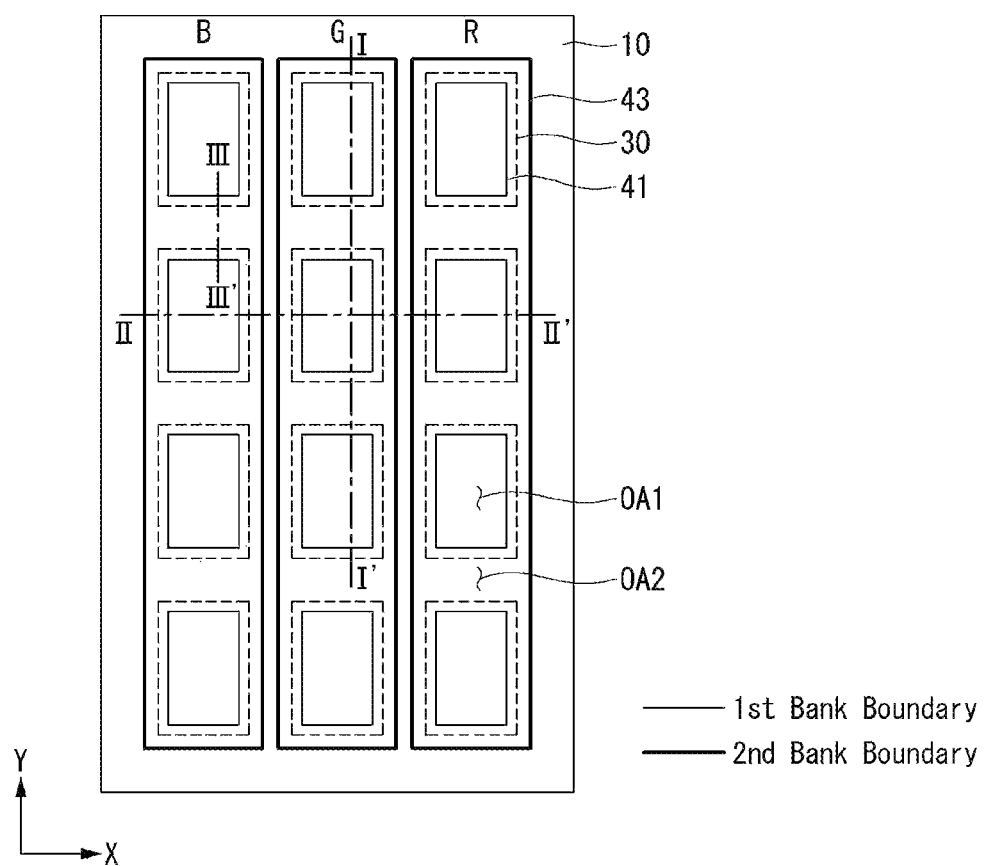
FIG. 2 is a schematic plan view of an organic light-emitting display device according to a first exemplary embodiment of the present disclosure.
Figure 3:
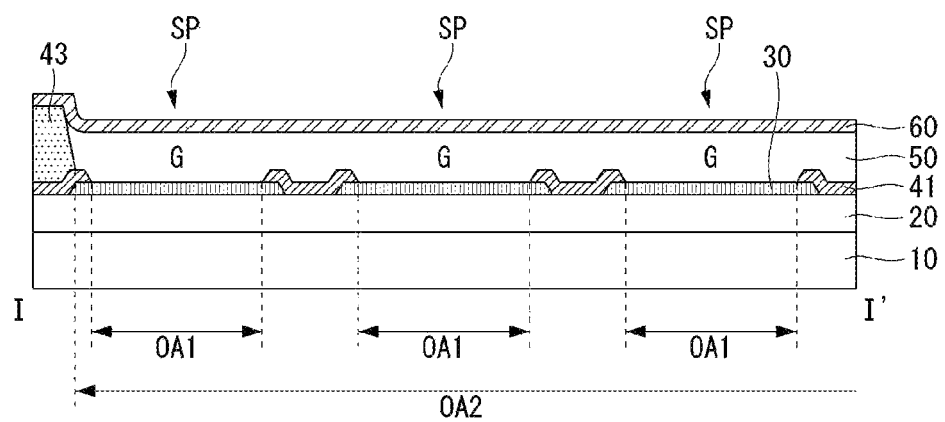
FIG. 3 is a cross-sectional view taken along the line I-I' in FIG. 2.
Figure 4:
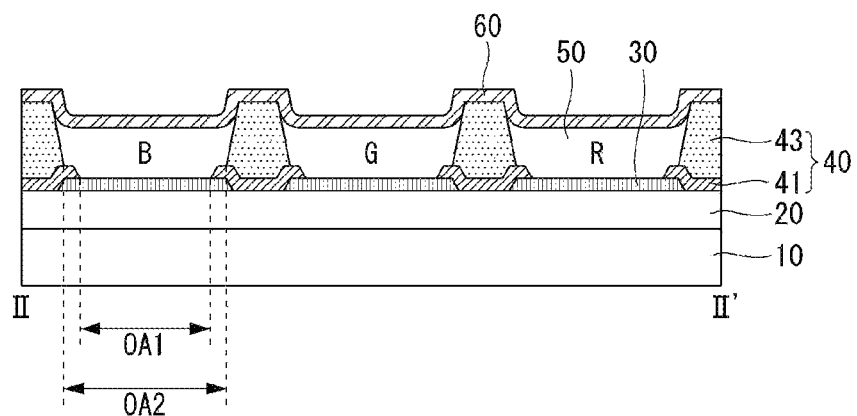
FIG. 4 is a cross-sectional view taken along the line II-II' in FIG. 2.
Figure 5:
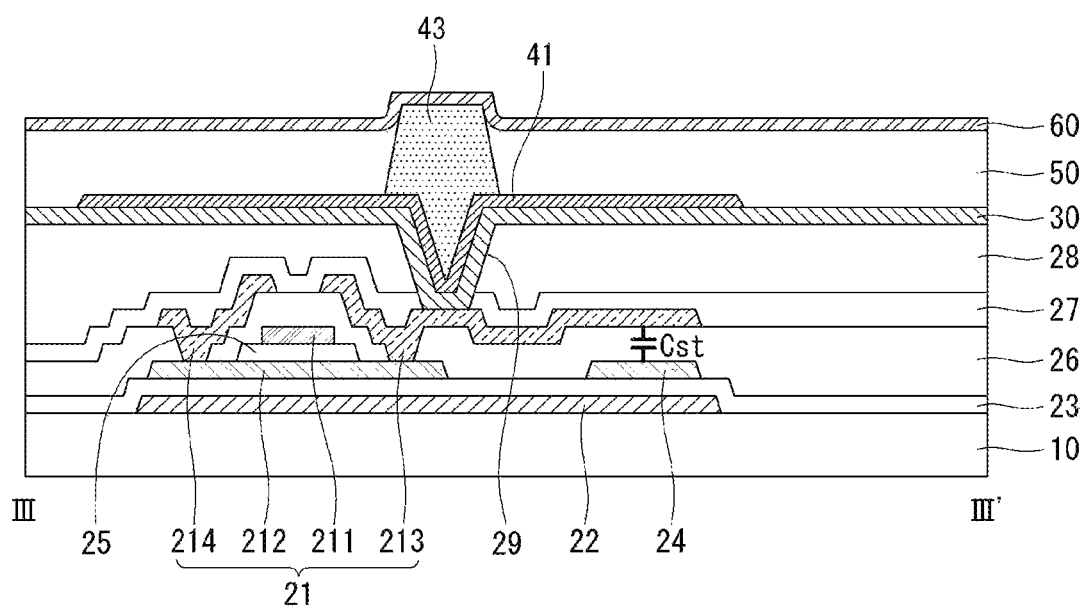
FIG. 5 is a cross-sectional view taken along the line in FIG. 2.

FIG. 2 is a schematic plan view of an organic light-emitting display device according to a first exemplary embodiment of the present disclosure. FIG. 3 is a cross-sectional view taken along the line I-I' in FIG. 2. FIG. 4 is a cross-sectional view taken along the line II-II' in FIG. 2. FIG. 5 is a cross-sectional view taken along the line in FIG. 2.

Referring to FIGS. 2 to 4, the organic light-emitting display device according to the first exemplary embodiment comprises a substrate 10 where sub-pixels SP are arranged. A circuit element layer 20 and organic light-emitting diodes are placed on the substrate 10. Organic light-emitting diodes may be driven by the elements of the circuit element layer 20. For example, the circuit element layer 20 may include a plurality of electrical components, circuits or the like, such as plurality of pixel or sub-pixel circuits, for driving the organic light-emitting diodes.

Signal lines and electrodes for applying driving signals to the organic light-emitting diodes may be arranged on the circuit element layer 20, and the signal lines and the electrodes may be placed separately with at least one insulating layer between them if necessary or desired. If the organic light-emitting display device is an active matrix (AM) display, the circuit element layer 20 may further comprise a transistor allocated for each sub-pixel SP.

Each organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode.

More specifically, the sub-pixels SP may be arranged along the first direction (e.g., X-axis direction) and second direction (e.g., Y-axis direction) which intersect each other. The sub-pixels SP arranged adjacent to each other along the first direction may emit light of different colors, and the sub-pixels SP arranged adjacent to each other along the second direction may emit light of the same color. The first electrodes 30 of the organic light-emitting diodes are placed on the sub-pixels SP. One first electrode 30 may be allocated for each sub-pixel SP.

A bank structure 40 (which may be referred to herein as a bank 40) is placed on the first electrodes 30. The bank 40 may include a first bank 41 and a second bank 43.

The first bank 41 may be located at least partially on the first electrodes 30. The first bank 41 comprises first openings OA1, e.g., first openings OA1 are formed in the first bank 41. The first opening OA1 exposes at least part of the first electrodes 30. For example, in some embodiments, each first opening OA1 exposes at least part of one first electrode 30. Thus, the number of first openings OA1 and the number of first electrodes 30 may be equal.

The first bank 41 may be made relatively thin so as to be covered by the organic light-emitting layer 50, as shown, for example in FIG. 3. The first bank 41 may be hydrophilic. In an example, the first bank 41 may be formed of a hydrophilic, inorganic insulating material such as silicon oxide ($SiO_2$) or silicon nitride ($SiNx$).

Although the drawings illustrate that the first openings OA1 are approximately rectangular, they are not limited to this shape, and the first openings OA1 may have various different shapes in various embodiments. Also, the drawings illustrate that all of the first openings OA1 have the same shape and area, but they are not limited to this and at least one first opening OA1 may have a different shape and/or area from another first opening OA1. For example, the shape and/or area of the first openings OA1 may be selected as desired in view of design considerations such as the lifetime of organic light-emitting materials for forming the organic light-emitting layer 50 of the organic light-emitting diodes. Parts of the first electrodes 30 exposed by the first openings OA1 may be defined as light-emitting regions.

The second bank 43 is placed on the substrate 10 where the first bank 41 is formed. For example, the second bank 43 may be located on portions of the first bank 41. The second bank 43 comprises second openings OA2. The second openings OA2 expose at least part of the first electrodes 30, for example, at least part of the first electrodes 30 may be exposed through the second openings OA2 in the second bank 43, as well as through the first openings OA1 in the first bank 41. A plurality of second openings OA2 are arranged in parallel in the first direction, and extend in the second direction. The second openings OA2 extend in the second direction and expose a plurality of first electrodes 30 arranged along the second direction. Additionally or alternatively, the second openings OA2 may extend in the second direction and expose a plurality of first openings OA1 arranged along the second direction. For example, as shown in FIG. 3, the second openings OA2 may extend along the second direction (e.g., the Y-axis direction), and the second openings OA2 may overlap or expose a plurality of first openings OA1 along the second direction.

The second bank 43 may be hydrophobic. In an example, the second bank 43 may be formed with a hydrophobic material coated on an organic insulating material or formed with an organic insulating material containing a hydrophobic material. The second bank 43 may be made of organic material. The hydrophobic nature of the second bank 43 may allow the organic light-emitting material constituting or included in the organic light-emitting layer 50 to be pushed to and collected at the center of the light-emitting region (e.g., near a central region of each of the exposed first electrodes 30). Also, the second bank 43 may function as a barrier that encloses the organic light-emitting material dropped into a corresponding region, so as to prevent organic light-emitting materials of different colors from being mixed together.

Although the drawings illustrate that the second openings OA2 are approximately rectangular, they are not limited to this shape, and the second openings OA2 may have various different shapes in various embodiments. Also, the drawings illustrate that all of the second openings OA2 have the same shape and area, but they are not limited to this and at least one second opening OA2 may have a different shape and/or area from another second opening OA2. For example, the shape and/or area of the second openings OA2 may be selected as desired in view of the lifetime of organic light-emitting materials.

The second openings OA2 are located on the outside of the first openings OA1, at a distance from them. That is, the boundary of the first bank 41 is spaced a preset or selected distance apart from the boundary of the second bank 43, and the boundaries of the second openings OA2 formed in the second bank 43 may laterally surround respective boundaries of the first openings OA1 formed in the first bank 41. Therefore, the first openings OA1 may be exposed by the second openings OA2.

The organic light-emitting layer 50 is placed on the substrate 10 where the second bank 43 is formed. The organic light-emitting layer 50 may be formed within the corresponding second openings OA2, in the direction in which the second openings OA2 extend. That is, the organic light-emitting material dropped into one second opening OA2 covers the first electrodes 30 and first bank 41 exposed by the second opening OA2, and are not physically separated by the first bank 41.

Organic light-emitting material of the same color is dropped on a plurality of first electrodes 30 exposed by one second opening OA2. This means that a plurality of sub-pixels SP allocated to positions corresponding to one second opening OA2 emit light of the same color. This is shown, for example, in FIG. 2 in which a plurality of green (G) sub-pixels SP are positioned within one second opening OA2.

The planar shape of the organic light-emitting layer 50 may correspond to the planar shape of the second openings OA2. For example, the organic light-emitting layer 50 may have a striped pattern that extends in the second direction in a planar view.

Organic light-emitting materials of different colors may be sequentially and alternately dropped in their corresponding second openings OA2. The organic light-emitting materials of different colors may comprise organic light-emitting materials that emit red (R), green (G), and blue (B) light, and if desirable in some embodiments, may further comprise an organic light-emitting material that emits white (W) light.

The second bank 43 is located between the first electrodes 30 adjacent to each other in the first direction, so that the organic light-emitting materials of different colors, dropped into the corresponding second openings OA2 adjacent to each other in the first direction, are kept from being mixed together. That is, the organic light-emitting materials of different colors dropped into different second openings OA2 are physically separated by the second bank 43.

The organic light-emitting material used to form the organic light-emitting layer 50 in the solution process is dropped in such a way as to cover at least part of the first electrodes 30, part of the first bank 41, and part of the second bank 43 (e.g., partially covering sidewalls of the second bank 43). The first bank 41 is a hydrophilic thin film provided to prevent a wettability problem due to the hydrophobic nature of the first electrode 30, and allows the hydrophilic, organic light-emitting material to spread well. The second bank 43 is a hydrophobic thick film that can push the hydrophilic organic light-emitting material to the center. By the combined structure of the first bank 41 and the second bank 43, the organic light-emitting layer 50 may be made relatively uniform in thickness in the light-emitting regions.

The organic light-emitting display device according to the first exemplary embodiment of the present disclosure may prevent deterioration in the uniformity of the organic light-emitting layer 50, thereby preventing a decrease in display quality due to varying thicknesses in the sub-pixels SP. Moreover, a decline in the device's lifetime or imperfections like dark spot formation may be prevented by ensuring the uniformity of the organic light-emitting layer 50.

The aforementioned preset or selected distance may be, in some embodiments, a minimum distance between the boundary of the first bank 41 and the boundary of the second bank 43 at which the organic light-emitting layer 50 can have uniform thickness. If the distance between the boundary of the first bank 41 and the boundary of the second bank 43 is shorter than the preset or selected distance, the organic light-emitting layer 50 cannot be made uniform. If the distance between the boundary of the first bank 41 and the boundary of the second bank 43 is longer than the preset or selected distance, the area of the first electrodes 30 which are enclosed by the first bank 41 increases, which can cause problems like a small aperture ratio.

In the organic light-emitting display device according to the first exemplary embodiment of the present disclosure, the second openings OA2 of the second bank 43 extend in the second direction (e.g., a long axis of the second bank 43 extends in the Y-axis direction), so that the second bank 43 is not located between the sub-pixels SP adjacent to each other in the second direction (e.g., the second bank 43 does not extend in the X-axis direction between adjacent sub-pixels SP of a column of sub-pixels extending in the Y-axis direction). Hence, in the first exemplary embodiment of the present disclosure, the aforementioned positional constraints on the first bank 41 become relatively loose, thereby improving the degree of design freedom and providing wide light-emitting regions on the first electrodes 30. Therefore, the first exemplary embodiment of the present disclosure may provide an organic light-emitting display device that offers a higher degree of design freedom and ensures a sufficiently large aperture ratio.

Moreover, in a high-resolution display device, the area of the sub-pixels SP is relatively smaller. In this case, organic light-emitting material is not dropped to its proper position, which may cause mixing of different colors of the organic light-emitting layer 50—that is, a color mixing defect. The first exemplary embodiment of the present disclosure has the advantage of improving such a color mixing defect, because organic light-emitting material is dropped onto a sufficiently large area in a second opening OA2 corresponding to a plurality of sub-pixels SP.

Referring to FIG. 5, the circuit element layer 20 may comprise transistors 21 electrically connected to the organic light-emitting diodes. In an example, a light shielding layer 22 is placed on the substrate 10. The light shielding layer 22 shields light coming from the outside and prevents photocurrent from being generated in the transistors 21. A buffer layer 23 is placed on the light shielding layer 22. The buffer layer 23 serves to protect thin-film transistors formed in a subsequent process from impurities such as alkali ions leaking out of the first substrate SUB1. The buffer layer 23 may be a silicon oxide (SiOx), a silicon nitride (SiNx), or multiple layers of these compounds.

A semiconductor layer 212 of the transistors 21 is placed on the buffer layer 23, and a capacitor lower electrode 24 is located apart from it. The semiconductor layer 212 and the capacitor lower electrode 24 may be formed of silicon semiconductor or oxide semiconductor. The silicon semiconductor may comprise amorphous silicon or crystallized polycrystalline silicon. The semiconductor layer 212 comprises a drain region and a source region each including p-type or n-type impurities, and also comprises a channel between the drain region and the source region. The capacitor lower electrode 24 may become conductive by being doped with impurities.

A gate insulating film 25 is placed on the semiconductor layer 212 and the capacitor lower electrode 24. The gate insulating film 25 may be silicon oxide SiOx, silicon nitride SiNx, or multiple layers of these compounds. A gate electrode 211 is placed on the gate insulating film 25, corresponding to a certain area of the semiconductor layer 212, that is, a channel for injecting an impurity. The gate electrode 211 may be made up of any one selected from the group consisting of molybdenum (Mo), aluminum (Al), chrome (Cr), gold (Au), titanium (Ti), nickel (Ni), neodymium (Nd), and copper (Cu) or multiple layers of alloys of these elements. Further, the gate electrode 211 may be a multilayer formed of one of molybdenum (Mo), aluminum (Al), chrome (Cr), gold (Au), titanium (Ti), nickel (Ni), neodymium (Nd), copper (Cu), or alloys of these elements. For example, the gate electrode 211 may consist of dual layers of molybdenum/aluminum-neodymium or molybdenum/aluminum.

An interlayer insulating film 26 for insulating the gate electrode 211 is placed on the gate electrode 211. The interlayer insulating film 26 may be a silicon oxide film (SiOx), a silicon nitride film (SiNx), or multiple layers of these compounds. A drain electrode 213 and a source electrode 214 are placed on the interlayer insulating film 26. The drain electrode 213 and the source electrode 214 are connected to the semiconductor layer 212 via contact holes exposing the source region of the semiconductor layer 212. The source electrode 213 and the drain electrode 214 may consist of a single layer or multiple layers. If the source electrode 213 and the drain electrode 214 consist of a single layer, they may be made up of any one selected from the group consisting of molybdenum (Mo), aluminum (Al), chrome (Cr), gold (Au), titanium (Ti), nickel (Ni), neodymium (Nd), and copper (Cu), or an alloy of these elements. On the other hand, if the source electrode 213 and the drain electrode 214 consist of multiple layers, they may be made up of two layers of molybdenum/aluminum-neodymium or three layers of titanium/aluminum/titanium, molybdenum/aluminum/molybdenum, or molybdenum/aluminum-neodymium/molybdenum. As such, a transistor 21 comprising the semiconductor layer 212, the gate electrode 211, the drain electrode 213, and the source electrode 214 is formed. Also, the drain electrode 214, which serves as a capacitor upper electrode, and the capacitor lower electrode 24 constitute a capacitor Cst.

A passivation film 27 is placed on the substrate 10 comprising the transistors 21 and the capacitor Cst. The passivation film 27 is an insulating film that protects the underlying elements, and may be a silicon oxide film (SiOx), a silicon nitride film (SiNx), or multiple layers of these compounds. An overcoat layer 28 is placed on the passivation film 27. The overcoat layer 28 may be a planarization film for smoothing out step differences on the underlying structure, and is made of an organic material such as polyimide, benzocyclobutene-based resin, acrylate, etc. Sub-pixel contact holes 29 are located in some region of the overcoat layer 28, which expose the source electrode 213 by exposing the passivation film 27.

The organic light-emitting diodes are placed on the overcoat layer 28. Each organic light-emitting diode comprises a first electrode 30 connected to a transistor, a second electrode 60 facing the first electrode 30, and the organic light-emitting layer 50 interposed between the first electrode 30 and the second electrode 60. The first electrode 30 may be an anode, and the second electrode 60 may be a cathode.

The first electrodes 30 are placed on the overcoat layer 28, and may be connected to the source electrodes 213 of the transistors through sub-pixel contact holes 29 penetrating the overcoat layer 28. One first electrode 30 may be allocated for each sub-pixel, but not limited thereto. The first electrode 30 may be made of a transparent conductive material, for example, ITO (indium tin oxide), IZO (indium zinc oxide), or ZnO (zinc oxide) according to a selected emission method and function as a transmissive electrode, or may include a reflective layer and function as a reflective electrode. The reflective layer may be made of aluminum (Al), copper (Cu), silver (Ag), nickel (Ni), or an alloy of these elements, preferably, APC (silver/palladium/copper alloy).

A bank 40 is placed on the substrate 10 where the first electrodes 30 are formed. The bank 40 comprises a first bank 41 and a second bank 43. The first bank 41 and the second bank 43 comprise openings that expose most of the first electrodes 30.

The organic light-emitting layer 50 is placed on the substrate 10 where the bank 40 is formed. The organic light-emitting layer 50 may further comprise one or more among an emission layer EML, a hole injection layer HIL, a hole transport layer HTL, an electron transport layer ETL, and an electron injection layer EIL.

The second electrode 60 is placed on the organic light-emitting layer 50. The second electrode 60 may be formed widely over the entire surface of the substrate 10. For example, the second electrode 60 may extend over and may be included as a part of a plurality of the sub-pixels SP. The second electrode 60 may function as transmissive electrode or reflective electrode according to a selected emission method. If the second electrode 60 is transmissive electrode, the second electrode 60 may be made of a transparent conductive material, such as ITO (indium tin oxide), IZO (indium zinc oxide), or ZnO (zinc oxide), and may be made of magnesium (Mg), calcium (Ca), aluminum (Al), silver (Ag), or an alloy thereof that is thin enough to pass light through. The structure shown in FIG. 5 may be applicable to other sub-pixels as well as the sub-pixels concerned.

Second Exemplary Embodiment

Figure 6:
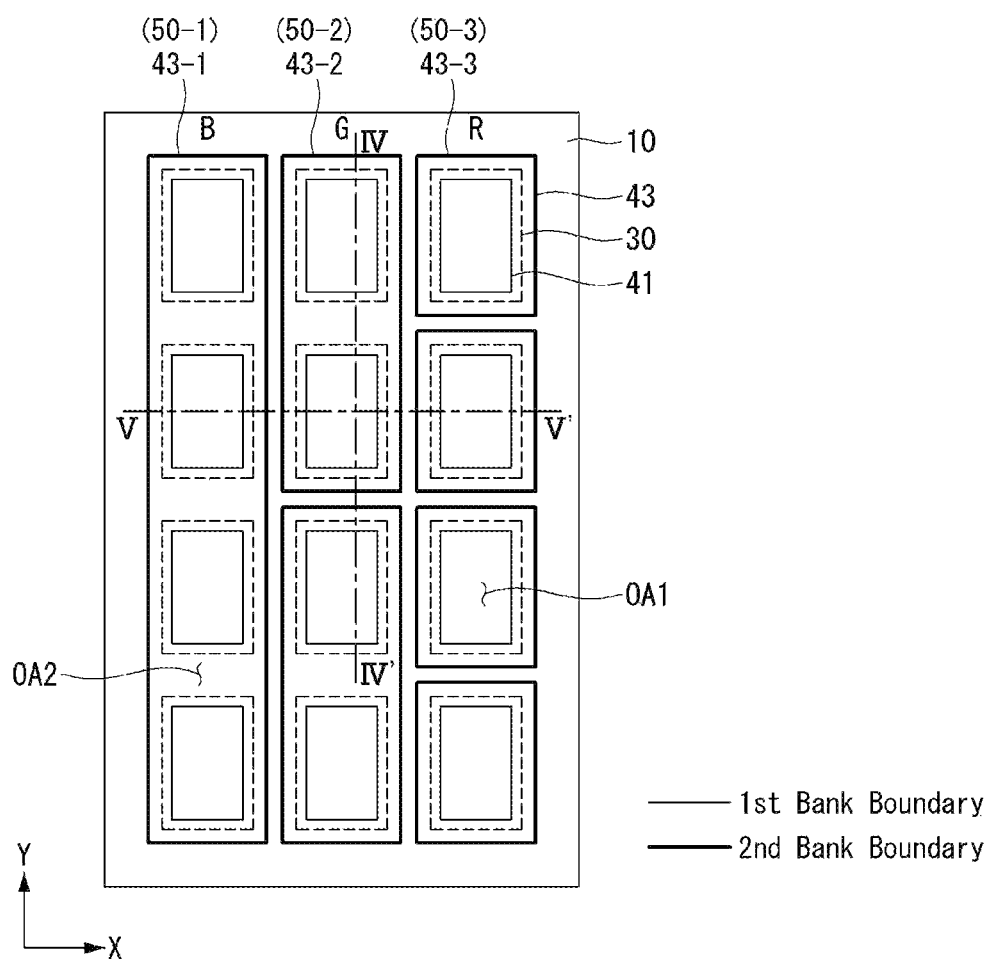
FIG. 6 is a schematic plan view of an organic light-emitting display device according to a second exemplary embodiment of the present disclosure.
Figure 7:
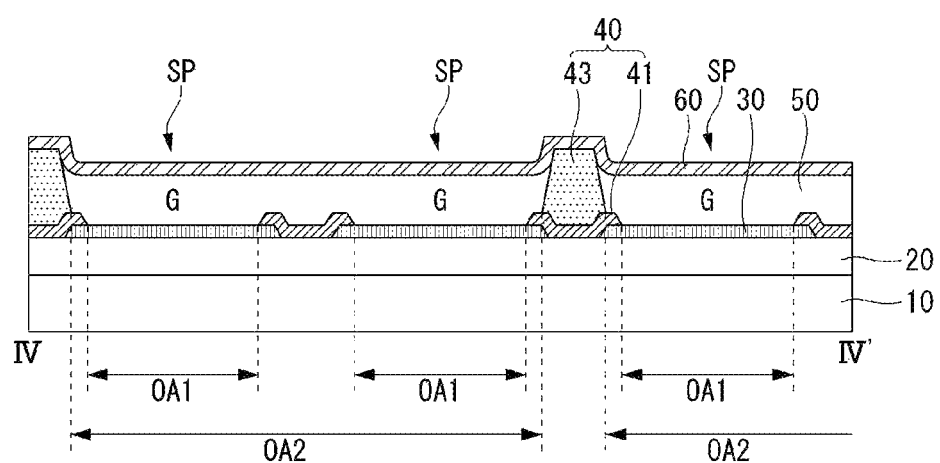
FIG. 7 is a cross-sectional view taken along the line IV-IV' in FIG. 6.
Figure 8:
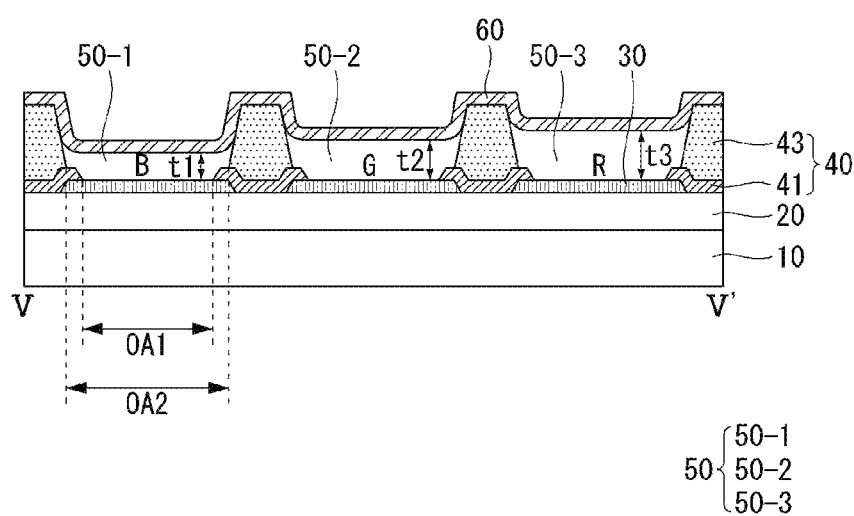
FIG. 8 is a cross-sectional view taken along the line V-V' in FIG. 6.
Figure 9A:
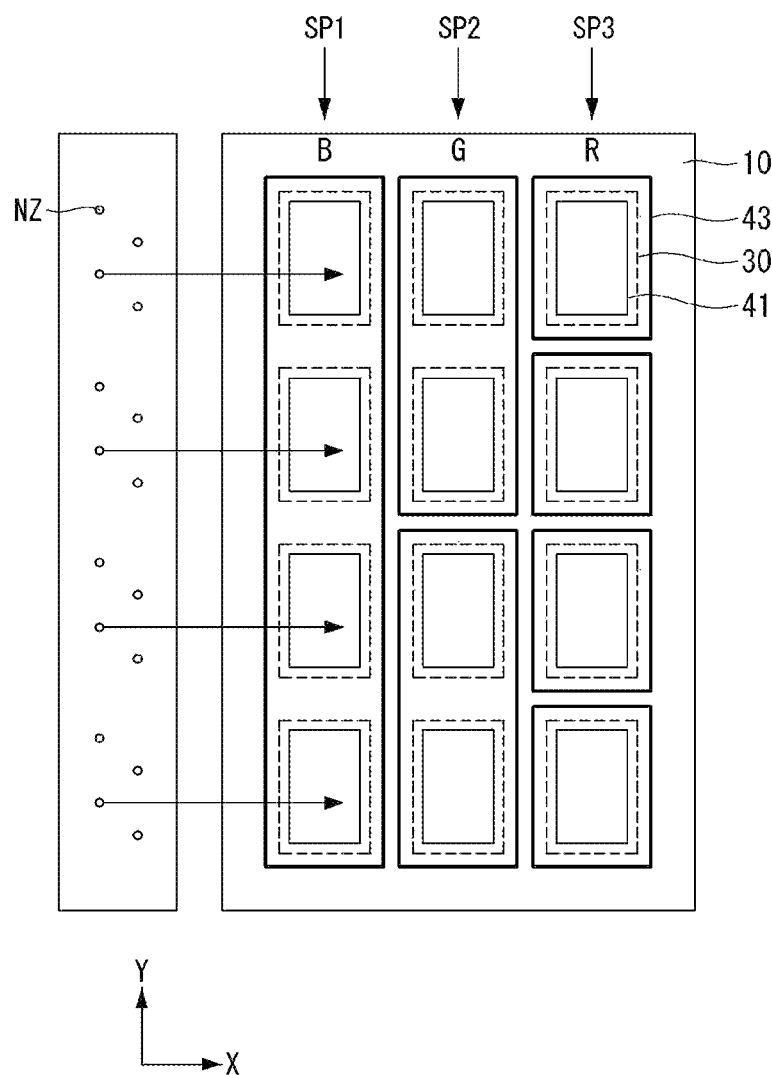
FIGS. 9A to 9C are plan views illustrating a dropping process using nozzles in a time sequence, according to one or more embodiments of the present disclosure.
Figure 9B:
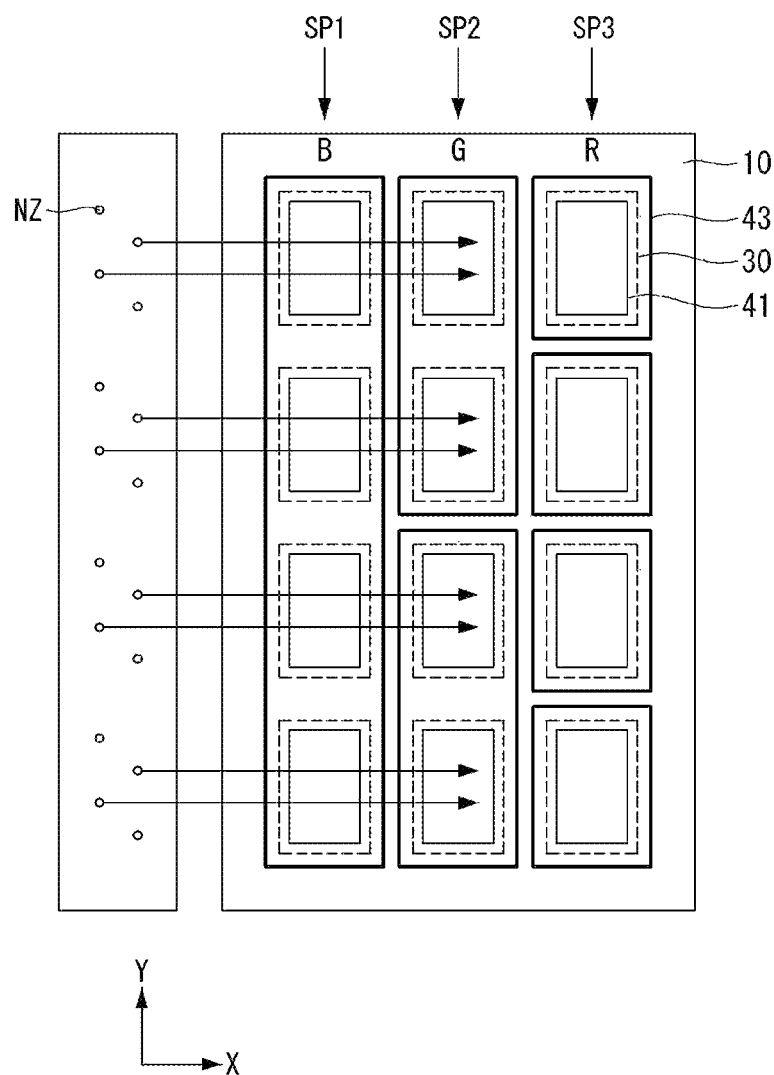
Figure 9C:
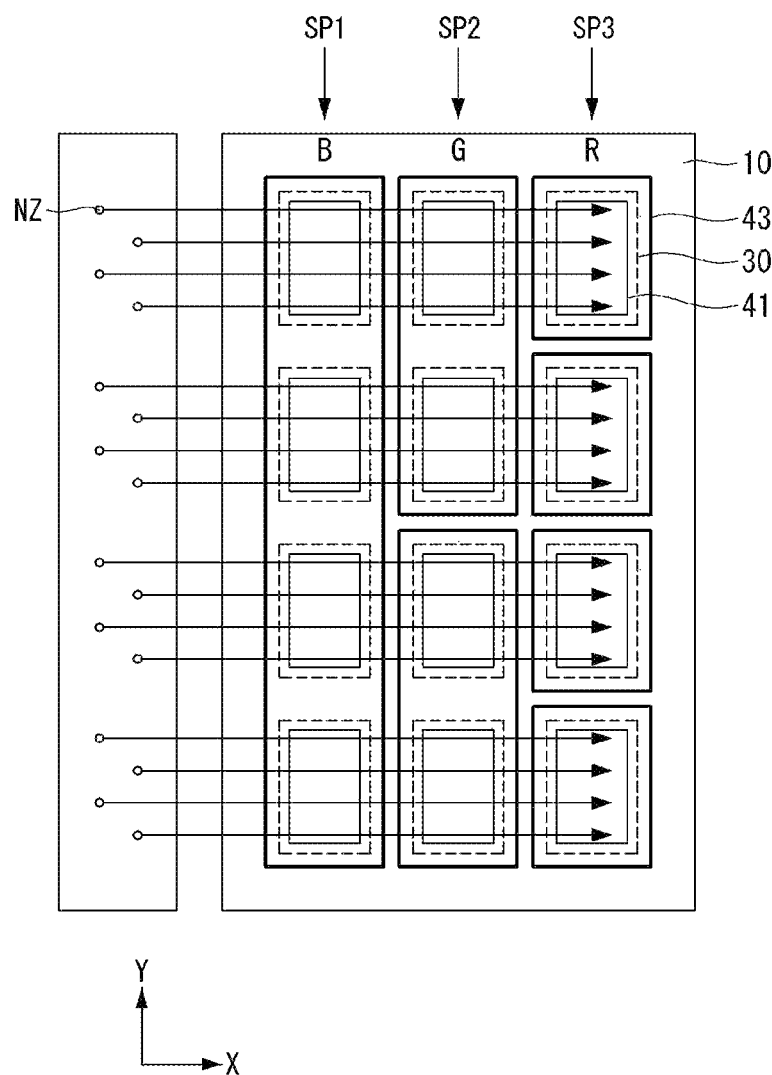

FIG. 6 is a schematic plan view of an organic light-emitting display device according to a second exemplary embodiment of the present disclosure. FIG. 7 is a cross-sectional view taken along the line IV-IV' in FIG. 6. FIG. 8 is a cross-sectional view taken along the line V-V' in FIG. 6. FIGS. 9A to 9C schematically illustrate a dropping process using nozzles in a time sequence.

If the area of the second openings is large enough as in the first exemplary embodiment, organic light-emitting material may be dropped onto a sufficiently large area, thereby effectively improving color mixing defects. However, once a color mixing defect occurs due to a process defect or the like, all the sub-pixels allocated to the second opening may become defective. The second exemplary embodiment of the present disclosure proposes a novel structure capable of minimizing the aforementioned defects.

Referring to FIGS. 6 to 8, the organic light-emitting display device according to the second exemplary embodiment comprises a substrate 10 where sub-pixels are arranged. A circuit element layer 20 and organic light-emitting diodes are placed on the substrate 10. Organic light-emitting diodes are driven by the elements of the circuit element layer 20.

The sub-pixels SP may be arranged along the first direction (e.g., X-axis direction) and second direction (e.g., Y-axis direction) which intersect each other. The sub-pixels SP arranged adjacent to each other along the first direction may emit light of different colors, and the sub-pixels SP arranged adjacent to each other along the second direction may emit light of the same color. The first electrodes 30 of the organic light-emitting diodes are placed in the sub-pixels SP. One first electrode 30 may be allocated for each sub-pixel SP.

A bank structure or bank 40 is placed on the first electrodes 30. The bank 40 may include a first bank 41 and a second bank 43.

The first bank 41 may be located at least partially on the first electrodes 30. The first bank 41 comprises first openings OA1. The first opening OA1 exposes at least part of the first electrodes 30. Each first opening OA1 may expose at least part of one first electrode 30. Thus, the number of first openings OA1 and the number of first electrodes 30 may be equal. Parts of the first electrodes 30 exposed by the first openings OA1 may be defined as light-emitting regions.

The first bank 41 may be made relatively thin so as to be covered by the organic light-emitting layer 50. The first bank 41 may be hydrophilic. In an example, the first bank 41 may be formed of a hydrophilic, inorganic insulating material such as silicon oxide (SiO2) or silicon nitride (SiNx).

The second bank 43 is placed on the substrate 10 where the first bank 41 is formed. The second bank 43 comprises second openings OA2. The second openings OA2 expose at least part of the first electrode 30, for example, at least part of the first electrodes 30 may be exposed through the second openings OA2 in the second bank 43, as well as through the first openings OA1 in the first bank 41. Each of the second openings OA2 exposes one or more first electrodes 30. Additionally or alternatively, each of the second openings OA2 exposes one or more first openings OA1.

The second bank 43 may be hydrophobic. In an example, the second bank 43 may be formed with a hydrophobic material coated on an organic insulating material or formed with an organic insulating material containing a hydrophobic material.

The organic light-emitting layer 50 is placed on the substrate 10 where the second bank 43 is formed. The organic light-emitting layer 50 may be formed within the corresponding second openings OA2. That is, the organic light-emitting material dropped into one second opening OA2 covers the first electrodes 30 and first bank 41 exposed by the second opening OA2, and are not physically separated by the first bank 41.

Organic light-emitting material of the same color is dropped on at least one first electrode 30 exposed by one second opening OA2. This means that one or more sub-pixels SP allocated to one second opening OA2 emit light of the same color.

The organic light-emitting layer 50 emitting light of different colors is formed within the second openings OA2 adjacent to each other in the first direction. The organic light-emitting layer 50 emitting light of the same color is formed within the second openings OA2 adjacent to each other in the second direction.

An organic light-emitting material of the same color may be simultaneously dropped into its corresponding second openings OA2 (for example, the second openings OA2 adjacent to each other in the second direction). Organic light-emitting materials of different colors may be sequentially and alternately dropped in their corresponding second openings OA2 (for example, the second openings OA2 neighboring in the first direction).

The second bank 43 is located between the first electrodes 30 adjacent to each other in the first direction, so that the organic light-emitting materials of different colors, dropped into the corresponding second openings OA2 adjacent to each other in the first direction, are kept from being mixed together. That is, the organic light-emitting materials of different colors dropped into the second openings OA2 neighboring in the first direction are physically separated by the second bank 43.

In the second exemplary embodiment of the present disclosure, the second bank 43 is also located between first electrodes 30 adjacent to each other in the second direction in a preset or selected region, so that the organic light-emitting materials dropped into the second openings OA2 adjacent to each other in the second direction are kept from being mixed together. That is, in a preset or selected region, the organic light-emitting material of the same color dropped into the second openings OA2 neighboring in the second direction is physically separated by the second bank 43. For example, as shown in FIG. 7, the second bank 43 is located in a preset or selected region between two adjacent first electrodes 30 that are adjacent to one another along the second direction (e.g., Y-axis direction).

As such, in the second exemplary embodiment of the present disclosure, at least some of the sub-pixels SP arranged along the second direction and emitting light of the same color in a preset or selected region may be sectioned off by the second bank 43. Accordingly, the second exemplary embodiment of the present disclosure is advantageous in that, once a color mixing defect occurs due to a process defect or the like, the number of defective sub-pixels SP is limited to the number of sub-pixels SP allocated in the second openings OA2.

More specifically, the number of first electrodes 30 exposed by one of the second openings OA2 and the number of first electrodes 30 exposed by another second opening OA2 may be different. For example, the second openings OA2 may include a first set of second openings 43-1 (which may be referred to herein as (2-1)th openings 43-1), a second set of second openings 43-2 (which may be referred to herein as (2-2)th openings 43-2), and a third set of second openings 43-3 (which may be referred to herein as (2-3)th openings 43-3) which are arranged adjacent to each other in the first direction. The (2-1)th openings 43-1 each expose n first electrodes 30 (n is a natural number equal to or greater than 1), the (2-2)th openings 43-2 each expose m first electrodes 30 (m is a natural number equal to or greater than 1), and the (2-3)th openings 43-3 each expose k first electrodes 30 (k is a natural number equal to or greater than 1). Here, at least one among n, m, and k is different from another.

For convenience of explanation, a description will be given below with an example in which n, m, and k have different values. Also, for convenience of explanation, a description will be given below with an example in which there are a first column of four sub-pixels SP1 emitting light of a first color, a second column of four sub-pixels SP2 emitting light of a second color, and a third column of four sub-pixels SP3 emitting light of a third color.

The sub-pixels SP1 in the first column comprise their respective first electrodes 30, and the first electrodes 30 in the first column of sub-pixels SP1 are exposed by one or more (2-1)th openings 43-1. A first organic light-emitting layer 50-1 emitting light of the first color is formed on the (2-1)th openings 43-1. The sub-pixels SP2 in the second column comprise their respective first electrodes 30, and the first electrodes 30 in the second column of sub-pixels SP2 are exposed by one or more (2-2)th openings 43-2. A second organic light-emitting layer 50-2 emitting light of the second color is formed on the (2-2)th openings 43-2. The sub-pixels SP3 in the third column comprise their respective first electrodes 30, and the first electrodes 30 in the third column of sub-pixels SP3 are exposed by one or more (2-3)th openings 43-3. A third organic light-emitting layer 50-3 emitting light of the third color is formed on the (2-3)th openings 43-3.

The thickness of at least one of the first organic light-emitting layer 50-1, second organic light-emitting layer 50-2, and third organic light-emitting layer 50-3 is different from the thickness of another. The thicknesses t1, t2, and t3 of the first organic light-emitting layer 50-1, second organic light-emitting layer 50-2, and third organic light-emitting layer 50-3 may be set in consideration of luminous efficiency. For example, a preset distance should be kept between the first electrodes 30 and the second electrodes 60, in order to give a microcavity effect to provide higher luminous efficiency. Here, the organic light-emitting layers 50-1, 50-2, and 50-3 should be configured to have different thicknesses t1, t2, and t3 for each sub-pixel SP because the preset distance needs to be set in consideration of the wavelength of light emitted from each sub-pixel SP. The longer the wavelength of light emitted from the organic light-emitting layer 50, the thicker it is. Assuming that the first color is blue (B), the second color is green (G), and the third color is red (R), the thicknesses of the first organic light-emitting layer 50-1, second organic light-emitting layer 50-2, and third organic light-emitting layer 50-3 are in the order named. Below is a description of an example in which the first color is blue (B), the second color is green (G), and the third color is (R).

The first organic light-emitting layer 50-1, second organic light-emitting layer 50-2, and third organic light-emitting layer 50-3 each comprise an emission layer EML, and may further comprise one or more common layers such as a hole injection layer HIL, a hole transport layer HTL, an electron transport layer ETL, and an electron injection layer EIL. The thicknesses of the first organic light-emitting layer 50-1, second organic light-emitting layer 50-2, and third organic light-emitting layer 50-3 may be adjusted by changing the thicknesses of the emission layer and/or common layers. For convenience of explanation, a description will be given of an example in which their thicknesses are adjusted by using the hole injection layer, which is one of the common layers.

The number of first electrodes 30 exposed by each of the (2-1)th openings 43-1, (2-2)th openings 43-2, and (2-3)th openings 43-3 may be set in consideration of facility deviation in the solution process, based on the thicknesses t1, t2, and t3 of the first organic light-emitting layer 50-1, second organic light-emitting layer 50-2, and third organic light-emitting layer 50-3.

The facility deviation in the solution process may refer to a discharge rate deviation between nozzles of inkjet equipment. That is, discharge rates of nozzles NZ used to drop organic light-emitting materials to the second openings OA2 are not uniform, and thus thicknesses of organic light-emitting materials dropped through the nozzles NZ do not meet a predetermined thickness (t1, t2, t3). To compensate for this, a plurality of nozzles NZ needs to be allocated to one second opening OA2. That is, there may be a thickness deviation in organic light-emitting materials dropped to the second openings OA2 due to a discharge rate deviation in the nozzles NZ when one nozzle NZ is allocated per second opening OA2, whereas the discharge rate deviation in the nozzles NZ is compensated and thus the organic light-emitting materials dropped to the second openings OA2 can have a uniform thickness when a plurality of nozzles NZ is allocated per second opening OA2. Below is a description of an example in which four nozzles are allocated to one second opening OA2 to compensate for discharge rate deviation.

TABLE 1

|  | Blue(B) HIL | Green(G) HIL | Red(R) HIL |
| --- | --- | --- | --- |
| Thickness of target per sub-pixel (SP) | 25 nm | 50 nm | 100 nm |
| Number of target drops per sub-pixel (SP) | 1 | 2 | 4 |
| Number of sub-pixels SP (or first electrodes 30) allocated within one second opening OA2 | 4 | 3 | 1 |

Referring further to FIGS. 9A to 9C and Table 1, the thickness of the hole injection layer allocated to each of the sub-pixels SP1 in the first column that emit blue light is set to 25 nm, the thickness of the hole injection layer allocated to each of the sub-pixels SP2 in the second column that emit green light is set to 50 nm, and the thickness of the hole injection layer allocated to each of the sub-pixels SP3 in the third column that emit red light is set to 100 nm. Process variables not explained below will be regarded as fixed.

Assuming that the thickness of the hole injection layer that can be formed through a single nozzle (NZ) drop process is 25 nm, one nozzle NZ may be allocated to each of the sub-pixels SP1 in the first column that emit light of the first color, two nozzles NZ may be allocated to each of the sub-pixels SP2 in the second column that emit light of the second color, and four nozzles NZ may be allocated to each of the sub-pixels SP3 in the third column that emit light of the third color, Based on this assumption, considering that four nozzles NZ need to be allocated to one second opening OA2 so as to compensate a discharge rate deviation, four sub-pixels SP1 may be allocated to each of the (2-1)th openings 43-1, two sub-pixels SP2 may be allocated to each of the (2-2)th openings 43-2, and one sub-pixel SP3 may be allocated to each of the (2-3)th openings 43-3.

From the above description, it can be inferred that, if n>m>k, the organic light-emitting layer 50 has the first organic light-emitting layer 50-1, second organic light-emitting layer 50-2, and third organic light-emitting layer 50-3, arranged in order of thickness t1, t2, and t3 from largest to smallest. This means that, if n>m>k, the organic light-emitting layer 50 has the first organic light-emitting layer 50-1, second organic light-emitting layer 50-2, and third organic light-emitting layer 50-3, arranged in order of wavelength from longest to shortest.

On the contrary, although not shown, it can be inferred that, if n<m<k, the organic light-emitting layer 50 has the first organic light-emitting layer 50-1, second organic light-emitting layer 50-2, and third organic light-emitting layer 50-3, arranged in order of thickness t1, t2, and t3 from smallest to largest. This means that, if n<m<k, the organic light-emitting layer 50 has the first organic light-emitting layer 50-1, second organic light-emitting layer 50-2, and third organic light-emitting layer 50-3, arranged in order of wavelength from shortest to largest.

In the present disclosure, the number of first electrodes 30 exposed by the second openings OA2 is controlled according to preset conditions. Accordingly, the present disclosure has the advantages of minimizing color mixing defects, improving luminous efficiency, and significantly improving display quality by adjusting the organic light-emitting layer 50 corresponding to each sub-pixel SP to have a preset uniform thickness.

Third Exemplary Embodiment

Figure 10:
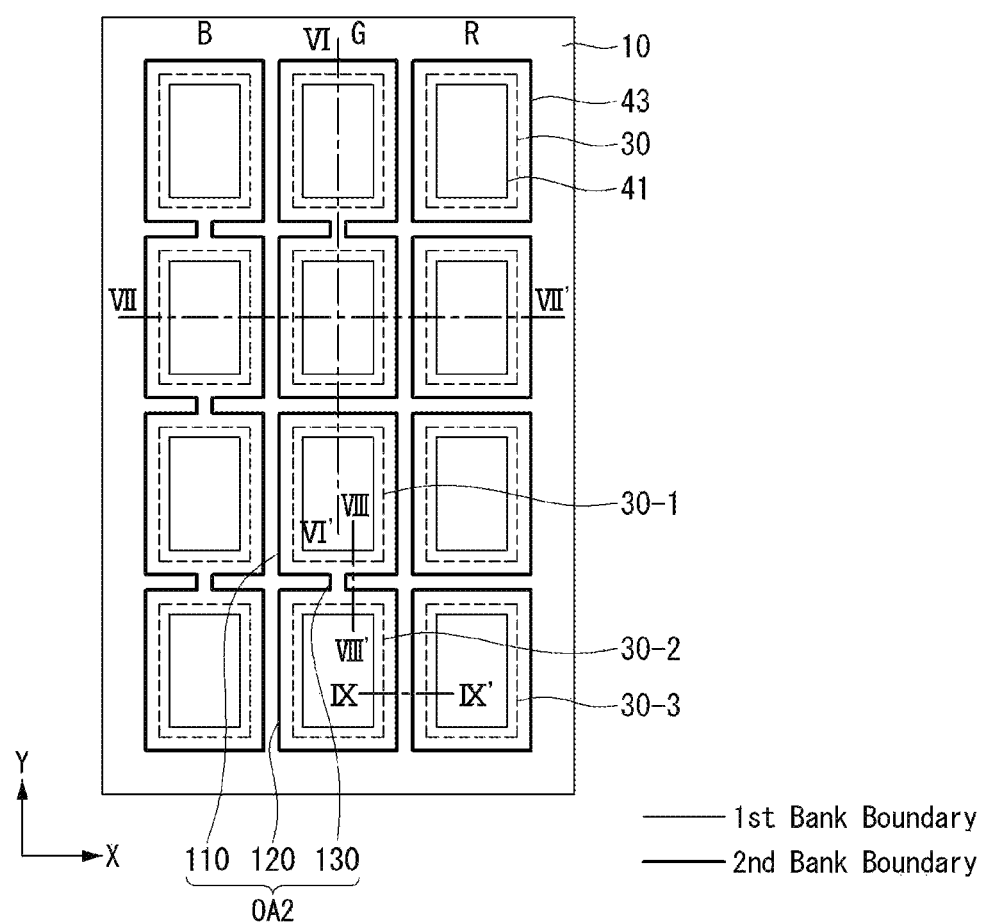
FIG. 10 is a schematic plan view of an organic light-emitting display device according to a third exemplary embodiment of the present disclosure.
Figure 11:
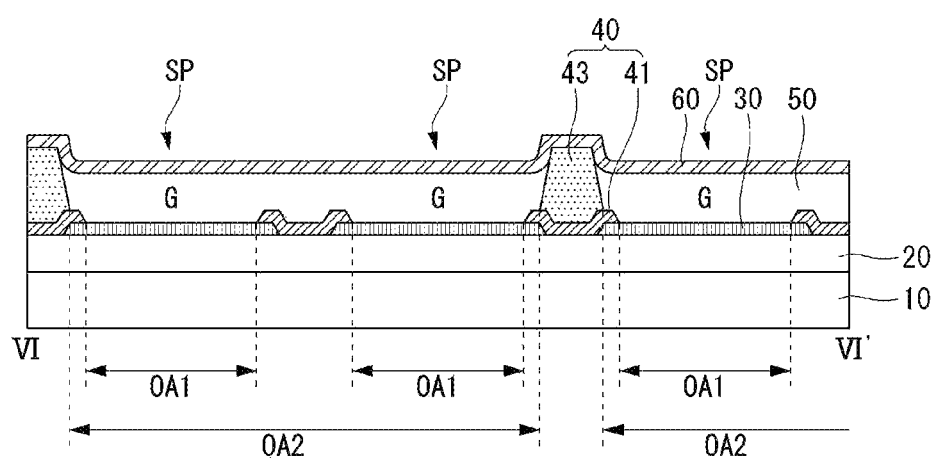
FIG. 11 is a cross-sectional view taken along the line VI-VI' in FIG. 10.
Figure 12:
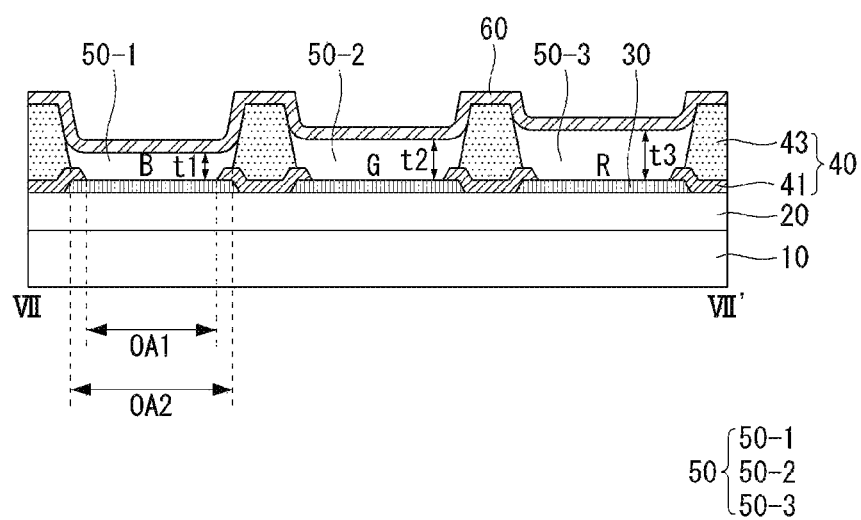
FIG. 12 is a cross-sectional view taken along the line VII-VII' in FIG. 10.
Figure 13:
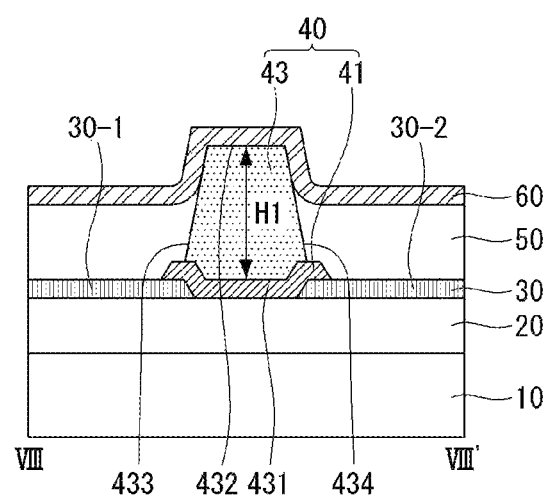
FIG. 13 is a cross-sectional view taken along the line VIII-VIII' in FIG. 10.
Figure 14:
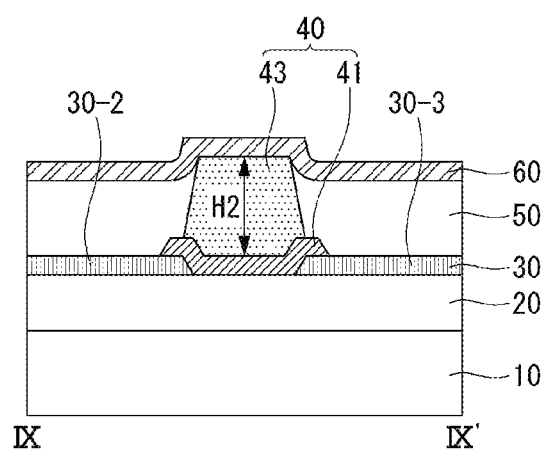
FIG. 14 is a cross-sectional view taken along the line IX-IX' in FIG. 10.
Figure 15:
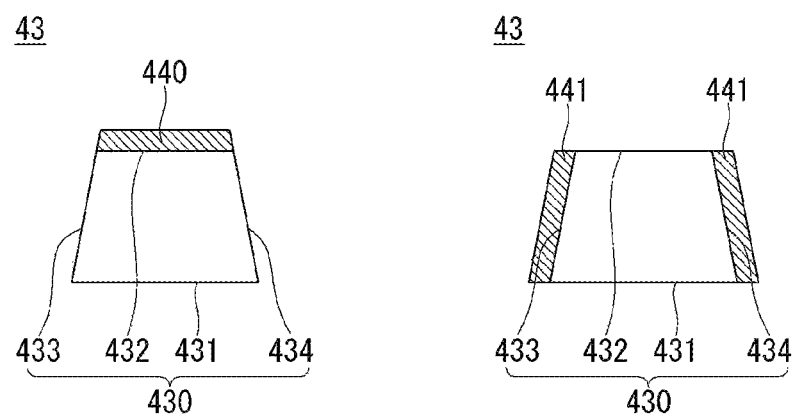
FIG. 15 is a view showing an example of the shape of a second bank, in accordance with one or more embodiments of the present disclosure.

FIG. 10 is a schematic plan view of an organic light-emitting display device according to a third exemplary embodiment of the present disclosure. FIG. 11 is a cross-sectional view taken along the line VI-VI' in FIG. 10. FIG. 12 is a cross-sectional view taken along the line VII-VII' in FIG. 10. FIG. 13 is a cross-sectional view taken along the line VIII-VIII' in FIG. 10. FIG. 14 is a cross-sectional view taken along the line IX-IX' in FIG. 10. FIG. 15 is a view showing an example of the shape of a second bank.

Referring to FIGS. 10 to 14, the organic light-emitting display device according to the third exemplary embodiment comprises a substrate 10 where sub-pixels are arranged. A circuit element layer 20 and organic light-emitting diodes are placed on the substrate 10. Organic light-emitting diodes are driven by the elements of the circuit element layer 20.

The sub-pixels SP may be arranged along the first direction (e.g., X-axis direction) and second direction (e.g., Y-axis direction) which intersect each other. The sub-pixels SP arranged adjacent to each other along the first direction may emit light of different colors, and the sub-pixels SP arranged adjacent to each other along the second direction may emit light of the same color. The first electrodes 30 of the organic light-emitting diodes are placed in the sub-pixels SP. One first electrode 30 may be allocated for each sub-pixel SP.

A bank 40 is placed on the first electrodes 30. The bank 40 comprises a first bank 41 and a second bank 43.

The first bank 41 is located on the first electrodes 30. The first bank 41 comprises first openings OA1. The first opening OA1 exposes at least part of the first electrode 30. Each first opening OA1 exposes one first electrode 30. Thus, the number of first openings OA1 and the number of first electrodes 30 may be equal. Parts of the first electrodes 30 exposed by the first openings OA1 may be defined as light-emitting regions.

The first bank 41 may be made relatively thin so as to be covered by the organic light-emitting layer 50. The first bank 41 may be hydrophilic. In an example, the first bank 41 may be formed of a hydrophilic, inorganic insulating material such as silicon oxide ($SiO_2$) or silicon nitride ($SiNx$).

The second bank 43 is placed on the substrate 10 where the first bank 41 is formed. The second bank 43 comprises second openings OA2. The second opening OA2 exposes at least part of the first electrode 30. Each of the second openings OA2 exposes one or more first electrodes 30. Alternatively, each of the second openings OA2 exposes one or more first openings OA1.

Referring further to FIG. 15, in an example, the second bank 43 may comprise a base layer 430 and a hydrophobic coating layer 440. The base layer 430 is hydrophilic. The base layer 430 comprises a bottom surface 431, a top surface 432 facing the bottom surface 431, a first side surface 433 connecting one side of the bottom surface 431 and one side of the top surface 432, and a second side surface 434 connecting the other side of the bottom surface 431 and the other side of the top surface 432. The hydrophobic coating layer 440 may be placed on the top surface 432 of the base layer 430.

In another example, the second bank 43 may comprise a base layer 430 and a hydrophilic coating layer 441. The base layer 430 is hydrophobic. The base layer 430 comprises a bottom surface 431, a top surface 432 facing the bottom surface 431, a first side surface 433 connecting one side of the bottom surface 431 and one side of the top surface 432, and a second side surface 434 connecting the other side of the bottom surface 431 and the other side of the top surface 432. The hydrophilic coating layer 441 may be placed on the first side 433 and second side 434 of the base layer 430.

Since the top surface 432 of the second bank 43 has relatively low surface energy due to its hydrophobic nature, it may push the organic light-emitting materials so that they collect in their positions. Moreover, since the side surfaces 433 and 434 of the second bank 43 have relatively high surface energy due to their hydrophilic nature, they may restrain the movement of the organic light-emitting materials which tend to form a lump at the center of the second openings OA2 by their surface tension after they are dropped, and may induce the organic light-emitting materials to spread evenly. Preferably, the surface energy of the side surfaces 433 and 434 is set higher than the surface energy of the first electrodes 30. Therefore, the organic light-emitting layer 50 may be formed in such a way as to have a uniform thickness within the second openings OA2 and a relatively large effective area (or light-emitting area).

The organic light-emitting layer 50 is placed on the substrate 10 where the second bank 43 is formed. The organic light-emitting layer 50 may be formed within the corresponding second openings OA2. That is, the organic light-emitting material dropped into one second opening OA2 covers the first electrodes 30 and first bank 41 exposed by the second opening OA2, and are not physically separated by the first bank 41 and second bank 43.

Organic light-emitting material of the same color is dropped on at least one first electrode 30 exposed by one second opening OA2. This means that one or more sub-pixels SP allocated to one second opening OA2 emit light of the same color.

The organic light-emitting layer 50 emitting light of different colors is formed within the second openings OA2 adjacent to each other in the first direction. The organic light-emitting layer 50 emitting light of the same color is formed within the second openings OA2 adjacent to each other in the second direction.

An organic light-emitting material of the same color may be simultaneously dropped into its corresponding second openings OA2 (for example, the second openings OA2 adjacent to each other in the second direction). Organic light-emitting materials of different colors may be sequentially and alternately dropped in their corresponding second openings OA2 (for example, the second openings OA2 adjacent to each other in the first direction).

The second bank 43 is located between the first electrodes 30 adjacent to each other in the first direction, so that the organic light-emitting materials of different colors, dropped into the corresponding second openings OA2 adjacent to each other in the first direction, are kept from being mixed together. That is, the organic light-emitting materials of different colors dropped into the second openings OA2 adjacent to each other in the first direction are physically separated by the second bank 43.

In the third exemplary embodiment of the present disclosure, unlike the first exemplary embodiment, the second bank 43 is also located between the first electrodes 30 adjacent to each other in the second direction in a preset region, so that the organic light-emitting materials dropped into the second openings OA2 adjacent to each other in the second direction are kept from being mixed together. That is, in a preset region, the organic light-emitting material of the same color dropped into the second openings OA2 adjacent to each other in the second direction is physically separated by the second bank 43.

As such, in the third exemplary embodiment of the present disclosure, unlike the first exemplary embodiment, the sub-pixels SP arranged along the second direction and emitting light of the same color in a preset region may be sectioned off by the second bank 43. Accordingly, the third exemplary embodiment of the present disclosure is advantageous in that, once a color mixing defect occurs due to a process defect or the like, the number of defective sub-pixels SP is limited to the number of sub-pixels SP allocated in the second openings OA2.

Meanwhile, the first electrodes 30 may comprise a (1-1)th electrode 30-1 (e.g., a first electrode 30 of a first sub-pixel) and a (1-2)th electrode 30-2 (e.g., a first electrode 30 of a second sub-pixel adjacent to the first pixel in the second direction) together exposed through one second opening OA2. In this case, the second opening OA2 comprises a first portion 110 exposing a (1-1)th electrode 30-1, a second portion 120 exposing a (1-2)th electrode 30-2, and a connecting portion 130 connecting the first portion 110 and the second portion 120. The connecting portion 130 has a smaller width than the first portion 110 and the second portion 120. Stated differently, at least one of the second openings OA2 may include a first portion that exposes the first electrode 30 of a first sub-pixel (e.g., the (1-1)th electrode 30-1), a second portion that exposes the first electrode 30 of a second sub-pixel that is adjacent to the first sub-pixel along the second direction (e.g., the (1-2)th electrode 30-2), and a connecting portion 130 that connects the first and second portions of the second opening OA2.

If the second openings OA2 each have a connecting portion 130, the side surfaces of the second bank 43 with which a dropped organic light-emitting material comes into contact have a larger surface area. Therefore, the third exemplary embodiment of the present disclosure allows for forming the organic light-emitting layer 50 with a more uniform thickness and a larger effective area.

Meanwhile, the first electrodes 30 (and/or sub-pixels) may have a rectangular or elliptical planar shape by which they are longer in the second direction than in the first direction. In this case, when drying a dropped organic light-emitting material, the organic light-emitting material may form a lump without spreading well in the second direction, which is the long axis direction, due to its tendency to collecting in a circular shape by its surface tension. To solve this problem, the third exemplary embodiment of the present disclosure may alter the shape of the second bank 43.

Specifically, the first electrodes 30 may further comprise (1-3)th electrodes 30-3 (e.g., a first electrode 30 of a third sub-pixel). A (1-1)th electrode 30-1 and a (1-2)th electrode 30-2 are exposed through one second opening OA2. A (1-3)th electrode 30-3 is exposed through another second opening OA2. Stated differently, at least one of the second openings OA2 may expose the first electrode 30 of a first sub-pixel (e.g., the (1-1)th electrode 30-1) and the first electrode 30 of a second sub-pixel that is adjacent to the first sub-pixel along the second direction (e.g., the (1-2)th electrode 30-2). At least one other second opening OA2 may expose the first electrode 30 of a third sub-pixel (e.g., the (1-3)th electrode 30-3) that is adjacent to the second sub-pixel along the first direction.

Here, to keep the dropped organic light-emitting material from forming a lump in the second direction, the thickness (or height) of the second bank 43 located between the first electrodes 30 neighboring in the second direction may be set larger than the thickness of the second bank 43 located between the first electrodes 30 neighboring in the first direction. For example, the second bank 43 located between the (1-1)th electrode 30-1 and (1-2)th electrode neighboring in the second direction may have a first thickness h1, and the second bank 43 located between the (1-2)th electrode 30-2 and (1-3)th electrode 30-3 neighboring in the first direction may have a second thickness h2. The first thickness h1 is set larger than the second thickness h2. As such, the third exemplary embodiment of the present disclosure may increase the surface area of the second bank 43 with which the dropped organic light-emitting material comes into contact, by setting the thickness of the second bank 43 located between the first electrodes 30 neighboring in the second direction to be relatively large. The third exemplary embodiment of the present disclosure can improve the formation of a lump of organic light-emitting material by controlling the shape of the second bank 43. Therefore, the third exemplary embodiment of the present disclosure allows for forming an organic light-emitting layer 50 with a relatively large effective area.

Additionally or alternatively, the length of the side surfaces of the second bank 43 may be controlled in order to keep the dropped organic light-emitting material from forming a lump in the second direction. For example, the side surfaces of the second bank 43 located between the first electrodes 30 adjacent to each other in the first direction (e.g., side surfaces of the second bank which extend in the second direction) may be set longer than the side surfaces of the second bank 43 located between the first electrodes 30 neighboring in the second direction (e.g., side surfaces of the second bank which extend in the first direction). Likewise, the surface area of the second bank 43 with which the dropped organic light-emitting material comes into contact may be increased, thereby improving the formation of a lump of the organic light-emitting material. Therefore, the third exemplary embodiment of the present disclosure allows for forming an organic light-emitting layer 50 with a relatively large effective area.

The third exemplary embodiment of the present disclosure is advantageous in that uniform brightness can be achieved by forming the organic light-emitting layer 50 with a uniform thickness and a higher aperture ratio can be obtained by forming the organic light-emitting layer 50 with a relatively large effective area.

Fourth Exemplary Embodiment

Figure 16:
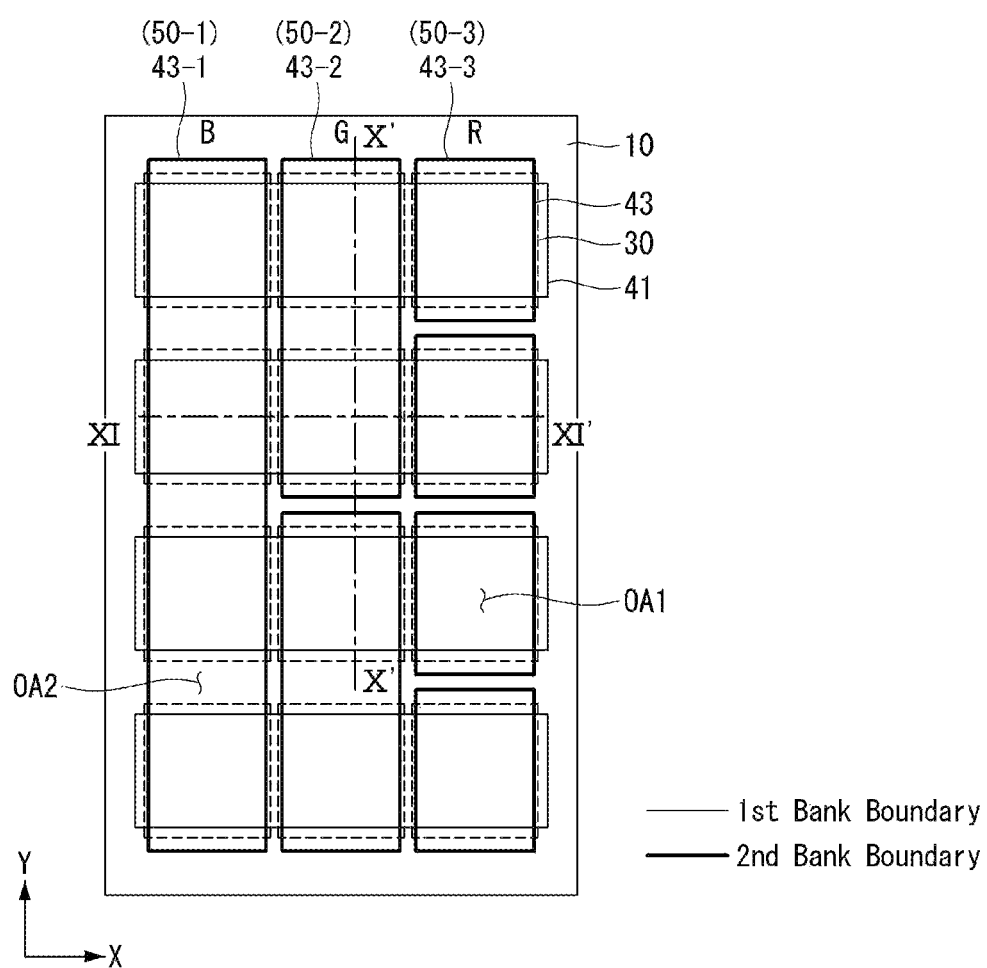
FIG. 16 is a schematic plan view of an organic light-emitting display device according to a fourth exemplary embodiment of the present disclosure.
Figure 17:
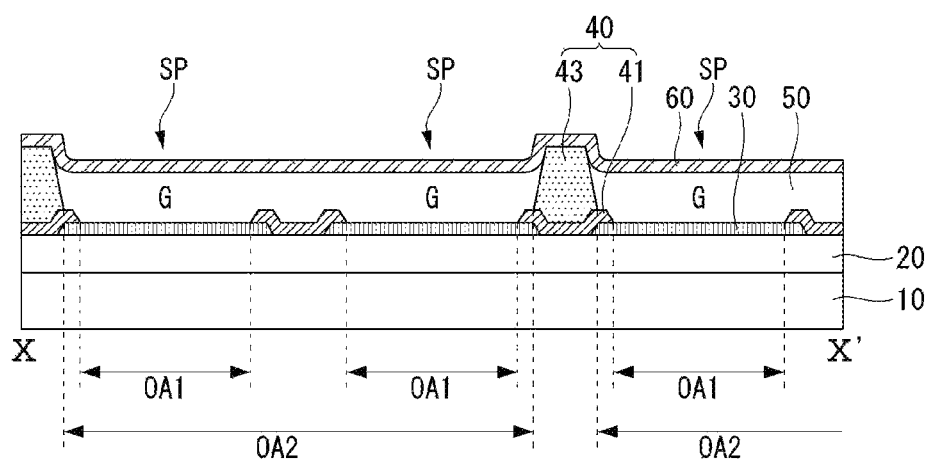
FIG. 17 is a cross-sectional view taken along the line X-X' in FIG. 16.
Figure 18:
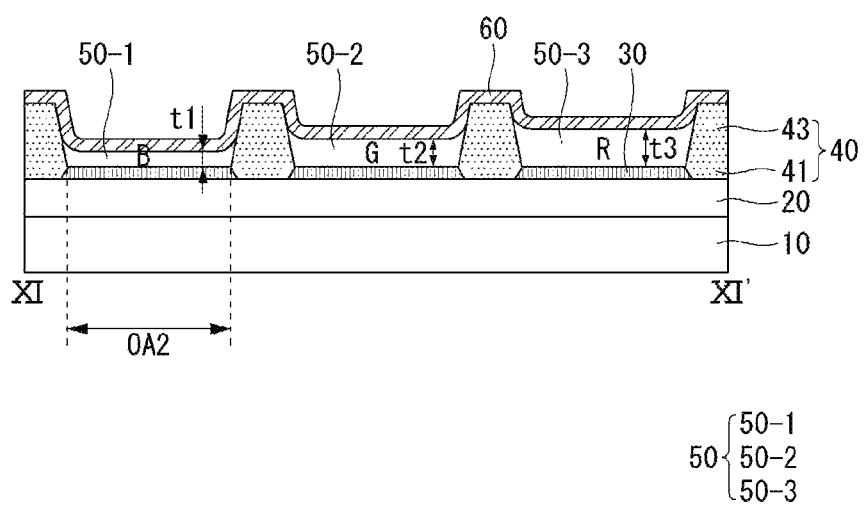
FIG. 18 is a cross-sectional view taken along the line XI-XI' in FIG. 16.

FIG. 16 is a schematic plan view of an organic light-emitting display device according to a fourth exemplary embodiment of the present disclosure. FIG. 17 is a cross-sectional view taken along the line X-X' in FIG. 16. FIG. 18 is a cross-sectional view taken along the line XI-XI' in FIG. 16.

Referring to FIGS. 16 to 18, the organic light-emitting display device according to the fourth exemplary embodiment comprises a substrate 10 where sub-pixels are arranged. A circuit element layer 20 and organic light-emitting diodes are placed on the substrate 10. Organic light-emitting diodes are driven by the elements of the circuit element layer 20, The sub-pixels SP may be arranged along the first direction (e.g., X-axis direction) and second direction (e.g., Y-axis direction) which intersect each other. The sub-pixels SP arranged adjacent to each other along the first direction may emit light of different colors, and the sub-pixels SP arranged adjacent to each other along the second direction may emit light of the same color. The first electrodes 30 of the organic light-emitting diodes are placed in the sub-pixels SP. One first electrode 30 may be allocated for each sub-pixel SP.

A bank 40 is placed on the first electrodes 30. The bank 40 comprises a first bank 41 and a second bank 43.

The first bank 41 is located on the first electrodes 30. The first bank 41 comprises first openings OA1. The first opening OA1 exposes at least part of the first electrode 30. A plurality of first openings OA1 are arranged in parallel in the second direction, and extend in the first direction. The first openings OA1 extend in the first direction, and expose a plurality of first electrodes 30 arranged along the first direction.

The first bank 41 may be made relatively thin so as to be covered by the organic light-emitting layer 50. The first bank 41 may be hydrophilic. In an example, the first bank 41 may be formed of a hydrophilic, inorganic insulating material such as silicon oxide (SiO2) or silicon nitride (SiNx).

The second bank 43 is placed on the substrate 10 where the first bank 41 is formed. The second bank 43 comprises second openings OA2. The second opening OA2 exposes at least part of the first electrode 30. Each of the second openings OA2 exposes one or more first electrodes 30. Alternatively, each of the second openings OA2 exposes one or more first openings OA1. Parts of the first electrodes 30 exposed by the intersections of the first openings OA1 and second openings OA2 may be defined as light-emitting regions.

The second bank 43 may be hydrophobic. In an example, the second bank 43 may be formed with a hydrophobic material coated on an organic insulating material or formed with an organic insulating material containing a hydrophobic material.

The organic light-emitting layer 50 is placed on the substrate 10 where the second bank 43 is formed. The organic light-emitting layer 50 may be formed within the corresponding second openings OA2. That is, the organic light-emitting material dropped into one second opening OA2 covers the first electrodes 30 and first bank 41 exposed by the second opening OA2, and are not physically separated by the first bank 41 and second bank 43.

Organic light-emitting material of the same color is dropped on at least one first electrode 30 exposed by one second opening OA2. This means that one or more sub-pixels SP allocated to one second opening OA2 emit light of the same color.

The organic light-emitting layer 50 emitting light of different colors is formed within the second openings OA2 adjacent to each other in the first direction. The organic light-emitting layer 50 emitting light of the same color is formed within the second openings OA2 adjacent to each other in the second direction.

An organic light-emitting material of the same color may be simultaneously dropped into its corresponding second openings OA2 (for example, the second openings OA2 neighboring in the second direction). Organic light-emitting materials of different colors may be sequentially and alternately dropped in their corresponding second openings OA2 (for example, the second openings OA2 neighboring in the first direction).

The second bank 43 is located between the first electrodes 30 adjacent to each other in the first direction, so that the organic light-emitting materials of different colors, dropped into the corresponding second openings OA2 adjacent to each other in the first direction, are kept from being mixed together. That is, the organic light-emitting materials of different colors dropped into the second openings OA2 adjacent to each other in the first direction are physically separated by the second bank 43.

In the fourth exemplary embodiment of the present disclosure, unlike the first exemplary embodiment, the second bank 43 is also located between the first electrodes 30 adjacent to each other in the second direction in a preset or selected region, so that the organic light-emitting materials dropped into the second openings OA2 adjacent to each other in the second direction are kept from being mixed together. That is, in a preset region, the organic light-emitting material of the same color dropped into the second openings OA2 adjacent to each other in the second direction is physically separated by the second bank 43.

As such, in the fourth exemplary embodiment of the present disclosure, unlike the first exemplary embodiment, the sub-pixels SP arranged along the first direction and emitting light of the same color in a preset region may be sectioned off by the second bank 43. Accordingly, the fourth exemplary embodiment of the present disclosure is advantageous in that, once a color mixing defect occurs due to a process defect or the like, the number of defective sub-pixels SP is limited to the number of sub-pixels SP allocated in the second openings OA2.

Referring further to FIG. 6, in the organic light-emitting display devices according to the second exemplary embodiment, both the first bank 41 and the second bank 43 are located between the pixels adjacent to each other in the first direction. In this case, the boundary of the first bank 41 needs to be spaced a preset or selected distance apart from the boundary of the second bank 43. Therefore, the first bank 41 masks the edges of the first electrodes 30 in the first direction by as much as the preset or selected distance. In this case, the area of the light-emitting regions is reduced by as much as the first electrodes 30 are masked.

Contrarily, in the organic light-emitting display device according to the fourth exemplary embodiment, the first bank 41 is not located between the pixels adjacent to each other in the first direction. That is, only the second bank 43 may be located between the pixels adjacent to each other in the first direction. Hence, in the fourth exemplary embodiment of the present disclosure, there are no positional constraints on the first bank 41 in the second direction, unlike the second exemplary embodiment, thereby providing wide light-emitting regions on the first electrodes 30. Therefore, the fourth exemplary embodiment of the present disclosure may provide an organic light-emitting display device that ensures a sufficiently large aperture ratio, compared to the second exemplary embodiment.

It will be apparent that those skilled in the art can make various modifications and changes thereto within the scope without departing from the technical spirit of the present disclosure through the above descriptions. Therefore, the technical scope of the present disclosure is not limited to the embodiment described above but should be defined by the appended claim The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device, comprising:
a substrate;
a plurality of sub-pixels on the substrate, each of the sub-pixels including an organic light-emitting diode having a first electrode;
a first bank having a plurality of first openings, each of the first openings at least partially exposing a respective one of the first electrodes; and
a second bank having a plurality of second openings, each of the second openings at least partially exposing one or more of the first electrodes,
wherein the plurality of second openings includes:
a first set of the second openings, each of the second openings of the first set exposing n first electrodes (n is a natural number equal to or greater than 1); and
a second set of the second openings, each of the second openings of the second set exposing m first electrodes (m is a natural number equal to or greater than 1),
wherein n and m are different values,
wherein the second bank includes:
a hydrophilic base layer having a bottom surface, a top surface facing the bottom surface, a first side surface, and a second side surface opposite the first side surface; and
a hydrophobic coating layer on the first side surface and the second side surface.

2. The organic light-emitting display device of claim 1, wherein each of the first openings exposes one of the first electrodes.

3. The organic light-emitting display device of claim 1, wherein each of the first openings exposes a plurality of the first electrodes extending in a first direction, and at least one of the second openings extends in a second direction that intersects the first direction.

4. The organic light-emitting display device of claim 3, wherein at least one of the second openings includes:
a first portion exposing the first electrode of a first sub-pixel;
a second portion exposing the first electrode of a second sub-pixel that is adjacent to the first sub-pixel along a second direction; and
a connecting portion connecting the first portion and the second portion, the connecting portion having a smaller width than the first portion and the second portion.

5. The organic light-emitting display device of claim 4, wherein the first electrodes have a planar shape that is longer in the second direction than in a first direction intersecting the second direction, and
the second bank has a bottom surface, a top surface facing the bottom surface, and side surfaces extending between the bottom surface and the top surface,
wherein the side surfaces of the second bank are hydrophilic.

6. The organic light-emitting display device of claim 5, wherein the at least one second opening exposing the first electrodes of the first and second sub-pixels differs in size from at least one other second opening exposing the first electrode of a third sub-pixel that is adjacent to the second sub-pixel along the first direction, and
wherein a first portion of the second bank located between the first electrodes of the first and second sub-pixels is thicker than a second portion of the second bank located between the first electrodes of the second and third sub-pixels.

7. The organic light-emitting display device of claim 5, wherein the side surfaces of the second bank extending in the second direction are longer than the side surfaces of the second bank extending in the first direction.

8. The organic light-emitting display device of claim 5, wherein a surface energy of the side surfaces of the second bank is higher than a surface energy of the first electrodes.

9. The organic light-emitting display device of claim 1, further comprising:
a first organic light-emitting layer in at least one of the second openings of the first set, the first organic light-emitting layer configured to emit light of a first color; and
a second organic light-emitting layer in at least one of the second openings of the second set, the second organic light-emitting layer configured to emit light of a second color,
wherein the first organic light-emitting layer and the second organic light-emitting layer have different thicknesses.

10. The organic light-emitting display device of claim 9, wherein n is greater than m, and the second organic light-emitting layer is thicker than the first organic light-emitting layer.

11. The organic light-emitting display device of claim 9, wherein n is greater than m, and the light of the second color has a longer wavelength than the light of the first color.

12. The organic light-emitting display device of claim 9, wherein each of the first and second organic light-emitting layers includes:
- an emission layer; and
- a common layer including at least one of a hole transport layer, a hole injection layer, an electron transport layer, or an electron injection layer,
- wherein thicknesses of the emission layers of the first and second organic light-emitting layers are different from each other or thicknesses of the common layers of the first and second organic light-emitting layers are different from each other.

13. The organic light-emitting display device of claim 1, wherein the first bank is hydrophilic.

14. An organic light-emitting display device, comprising:
- a substrate;
- a plurality of sub-pixels on the substrate, each of the sub-pixels including an organic light-emitting diode having a first electrode;
- a first bank having first openings each exposing at least one of the first electrodes; and
- a second bank having second openings each exposing at least one of the first electrodes,
- wherein a number of first electrodes exposed by a first one of the second openings is different from a number of first electrodes exposed by a second one of the second openings,
- wherein the second bank includes:
  - a hydrophilic base layer having a bottom surface, a top surface facing the bottom surface, a first side surface, and a second side surface opposite the first side surface; and
  - a hydrophobic coating layer on the first side surface and the second side surface.

15. The organic light-emitting display device of claim 14, further comprising:
- a first organic light-emitting layer in the first one of the second openings; and
- a second organic light-emitting layer in the second one of the second openings,
- wherein the first organic light-emitting layer emits light of a first color, and the second organic light-emitting layer emits light of a second color that is different from the first color.

16. The organic light-emitting display device of claim 15, wherein the first organic light-emitting layer and the second organic light-emitting layer have different thicknesses.

17. The organic light-emitting display device of claim 14, wherein the first bank is hydrophilic.

18. The organic light-emitting display device of claim 14, wherein each of the second openings overlaps at least one of the first openings.

* * * * *